(12) United States Patent
Tsai et al.

(10) Patent No.: US 10,804,378 B2
(45) Date of Patent: Oct. 13, 2020

(54) METHOD FOR SEMICONDUCTOR DEVICE FABRICATION WITH IMPROVED EPITAXIAL SOURCE/DRAIN PROXIMITY CONTROL

(71) Applicant: Taiwan Semiconductor Manufacturing Co., Ltd., Hsinchu (TW)

(72) Inventors: Fu-Tsun Tsai, Tainan (TW); Tong Jun Huang, Hsinchu (TW); I-Chih Chen, Tainan (TW); Chi-Cherng Jeng, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 77 days.

(21) Appl. No.: 15/934,017

(22) Filed: Mar. 23, 2018

(65) Prior Publication Data

US 2019/0165138 A1    May 30, 2019

Related U.S. Application Data

(60) Provisional application No. 62/591,961, filed on Nov. 29, 2017.

(51) Int. Cl.
*H01L 21/8234* (2006.01)
*H01L 29/66* (2006.01)
(Continued)

(52) U.S. Cl.
CPC .. *H01L 29/66795* (2013.01); *H01L 21/02532* (2013.01); *H01L 21/02617* (2013.01);
(Continued)

(58) Field of Classification Search
CPC ............... H01L 21/823431; H01L 21/823821
See application file for complete search history.

(56) References Cited

U.S. PATENT DOCUMENTS

| 8,836,016 B2 | 9/2014 | Wu et al. |
| 8,841,701 B2 | 9/2014 | Lin et al. |

(Continued)

FOREIGN PATENT DOCUMENTS

| KR | 20130058402 A | 6/2013 |
| KR | 20150133012 A | 11/2015 |
| KR | 20170090996 A | 8/2017 |

*Primary Examiner* — Moazzam Hossain
*Assistant Examiner* — Hajar Kolahdouzan
(74) *Attorney, Agent, or Firm* — Haynes and Boone, LLP

(57) ABSTRACT

A method is performed to a structure that includes a substrate with first and second regions for logic and RF devices respectively, first fin and first gate structure over the first region, second fin and second gate structure over the second region, and gate spacers over sidewalls of the gate structures. The method includes performing a first etching to the first fin to form a first recess; and performing a second etching to the second fin to form a second recess. The first and second etching are tuned to differ in at least one parameter such that the first recess is shallower than the second recess and a first distance between the first recess and the first gate structure along the first fin lengthwise is smaller than a second distance between the second recess and the second gate structure along the second fin lengthwise.

20 Claims, 11 Drawing Sheets

(51) Int. Cl.
    *H01L 21/02*     (2006.01)
    *H01L 29/08*     (2006.01)
    *H01L 29/78*     (2006.01)
    *H01L 29/165*     (2006.01)
    *H01L 27/088*     (2006.01)
    *H01L 21/311*     (2006.01)
    *H01L 27/092*     (2006.01)
    *H01L 21/8238*     (2006.01)

(52) U.S. Cl.
    CPC .... *H01L 21/311* (2013.01); *H01L 21/823431* (2013.01); *H01L 21/823821* (2013.01); *H01L 27/0886* (2013.01); *H01L 27/0924* (2013.01); *H01L 29/0847* (2013.01); *H01L 29/165* (2013.01); *H01L 29/7853* (2013.01)

(56) References Cited

U.S. PATENT DOCUMENTS

| | | |
|---|---|---|
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,520,482 B1 | 12/2016 | Chang et al. |
| 9,576,814 B2 | 2/2017 | Wu et al. |
| 2018/0182747 A1* | 6/2018 | Kim .................... H01L 27/0248 |
| 2018/0182756 A1* | 6/2018 | Lee .................... H01L 27/0886 |

* cited by examiner

US 10,804,378 B2

METHOD FOR SEMICONDUCTOR DEVICE FABRICATION WITH IMPROVED EPITAXIAL SOURCE/DRAIN PROXIMITY CONTROL

PRIORITY

This application claims the benefits of U.S. Prov. App. Ser. No. 62/591,961, filed on Nov. 29, 2017, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as the device geometry shrinks, coupling capacitance between source/drain features and nearby gates has increased. In some instances, the increased coupling capacitance lowers down the operating frequency of the transistors. This has become more evident in FinFET devices than in planar devices and has affected transistors for radio frequency (RF) devices ("RF transistors") more adversely than those for logic devices ("logic transistors"). How to reduce the coupling capacitance for RF transistors (particularly RF FinFET transistors) while maintaining high overall transistor density in an IC is an object of the present disclosure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
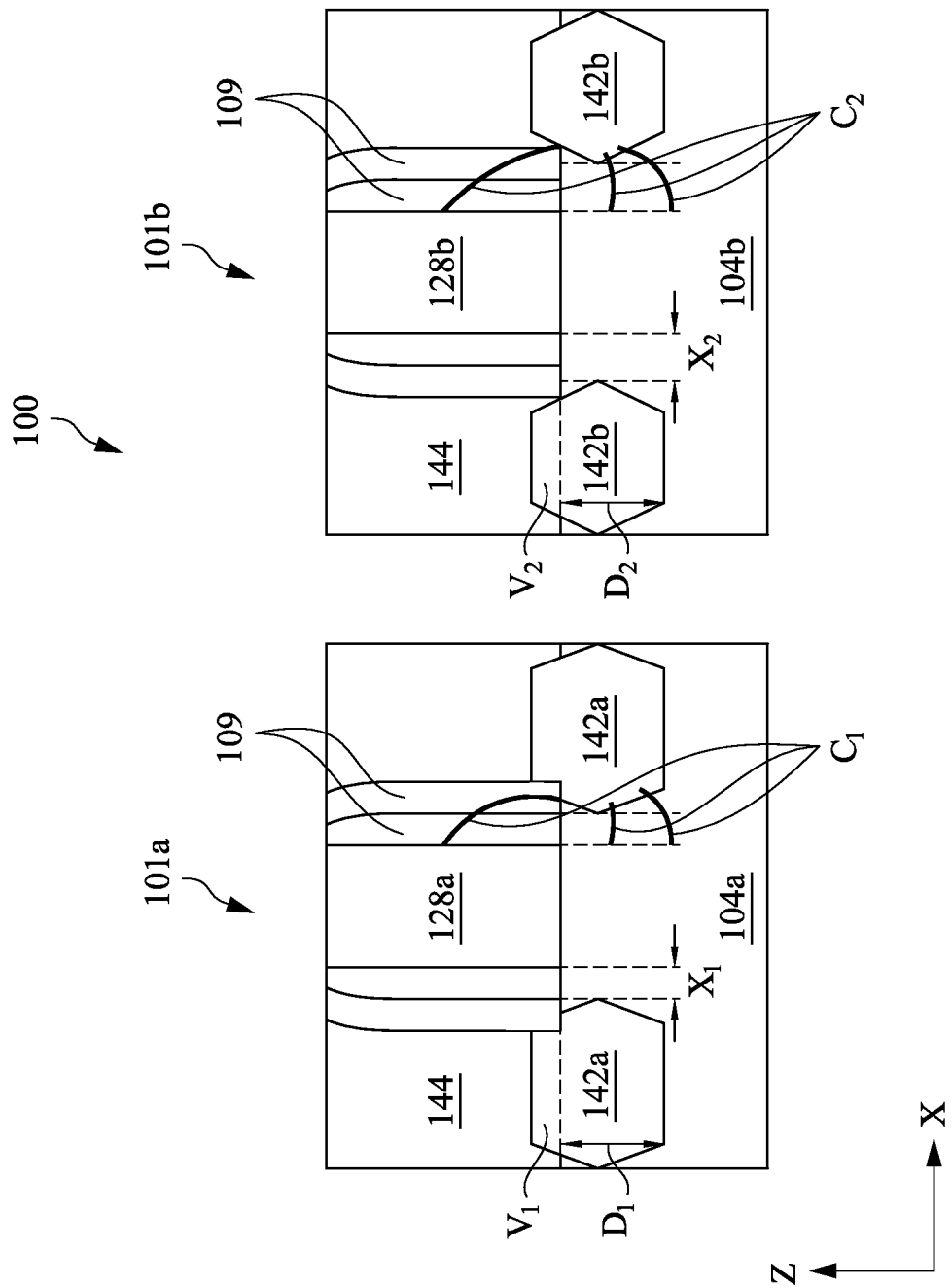
FIG. 1 illustrates cross-sectional views of a semiconductor structure, in portion, constructed according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to methods of forming field effect transistors (FETs) having raised epitaxial S/D features in RF devices (or circuits) and logic devices (or circuits). For example, RF devices may perform power amplification, splitting, and/or combining; and logic devices may perform input/output (I/O) functions and logic functions including AND, OR, NOR, and inverters, as well as other functions. Generally, RF devices operate at a frequency about ten times higher than logic devices. For example, RF devices may operate at a frequency in a range from 10 GHz to 500 GHz, such as from 20 GHz to 500 GHz, while logic devices may operate at a frequency below 20 GHz. Further, RF devices and logic devices may be in separate regions of an IC or may be mixed in a common region of an IC. Design objectives for transistors in RF devices ("RF transistors") and those in logic devices ("logic transistors") may be different. For RF transistors, a lower coupling capacitance between source/chain (S/D) features and nearby gates is highly desired so as to improve the operating frequency of the RF transistors.

Referring to FIG. 1, shown therein are cross-sectional views of a semiconductor device 100, in portion, constructed according to the present disclosure. The semiconductor device 100 includes a first transistor 101a and a second transistor 101b. The transistors 101a and 101b are FinFET in the shown embodiment. Alternatively, they may be planar transistors or other types of three-dimensional transistors. Particularly, the transistor 101a is a logic transistor (i.e., a transistor performing a logic function of an IC), and the transistor 101b is an RF transistor (i.e., a transistor performing an RF function of an IC).

The logic transistor 101a includes a semiconductor fin 104a, epitaxial S/D features 142a at least partially embedded in the semiconductor fin 104a, a gate structure 128a engaging the semiconductor fin 104a between the epitaxial S/D features 142a, gate spacers 109 on sidewalls of the gate structure 128a, and interlayer dielectric (ILD) layer 144 over the semiconductor fin 104a, the S/D features 142a, and surrounding the gate spacers 109 and the gate structure 128a.

The RF transistor 101b includes a semiconductor fin 104b, epitaxial S/D features 142b at least partially embedded in the semiconductor fin 104b, a gate structure 128b engaging the semiconductor fin 104b between the epitaxial S/D features 142b, gate spacers 109 on sidewalls of the gate structure 128b, and the ILD layer 144 over the semiconductor fin 104b, the S/D features 142b, and surrounding the gate spacers 109 and the gate structure 128b.

The epitaxial S/D features 142a are distanced from the gate structure 128a by a first distance (or proximity) $X_1$ along the lengthwise direction of the semiconductor fin 104a. The epitaxial S/D features 142b are distanced from the gate structure 128b by a second distance (or proximity) $X_2$ along the lengthwise direction of the semiconductor fin 104b. In the present embodiment, the lengthwise directions of the semiconductor fins 104a and 104b are the same (both along the X direction). In alternative embodiments, the lengthwise directions of the semiconductor fins 104a and 104b may be different. In other words, the semiconductors fins 104a and 104b may be oriented along the same or different directions in various embodiments. In the present embodiment, the distance $X_1$ is smaller than the distance $X_2$. In an embodiment, a ratio between $X_1$ and $X_2$ is in a range from 1:1.2 to 1:3, such as from 1:2 to 1:3. The specific ratios are designed to provide the following benefits: a smaller distance $X_1$ allows the epitaxial S/D features 142a to apply greater stress to the channel of the logic transistor 101a and to increase carrier mobility thereof, and a greater distance $X_2$ reduces the coupling capacitance $C_2$ between the epitaxial S/D features 142b and the gate structure 128b thereby improving frequency response of the RF transistor 101b. For the logic transistor 101a, the coupling capacitance $C_1$ between the epitaxial S/D features 142a and the gate structure 128a may be greater than the coupling capacitance $C_2$, but is within an acceptable range for logic devices that operate at a lower frequency than the RF devices. The above range of ratio (X1:X2 is about from 1:1.2 to 1:3) is selected to balance out the two competing factors: coupling capacitance and carrier mobility, for both the logic transistor 101a and the RF transistor 101b in the same integrated circuit. If the ratio is outside this range, then either the logic transistor 101a or the RF transistor 101b may suffer from degraded performance, for example, resulting in slower operation speed. For example, if X1 is kept as is and X2 is too big, then the coupling capacitance in the RF transistor decreases but its carrier mobility decreases too, decreasing its operation speed. For example, if X2 is kept as is and X1 is too big, then the coupling capacitance in the logic transistor decreases but its carrier mobility decreases too, decreasing its operation speed.

Further, the epitaxial S/D features 142a and 142b extend into the fins 104a and 104b by depths $D_1$ and $D_2$, respectively. In an embodiment, the depth $D_2$ is configured to be greater than $D_1$. This effectively increases the width of the source/drain features, as well as the width of the channel region of the RF transistor 101b, thereby increasing the saturation current of the RF transistor 101b. With a higher saturation current, the RF transistor 101b provides a higher oscillation frequency and voltage gain for the benefits of RF applications. Still further, a portion of each epitaxial S/D feature 142a that extends above the fin 104a has a volume $V_1$, and a portion of each epitaxial S/D feature 142b that extends above the fin 104b has a volume $V_2$. In an embodiment, the volume $V_2$ is configured to be smaller than the volume $V_1$. Having a smaller volume $V_2$ above the fin 104b reduces the coupling capacitance $C_2$ between the gate 128b and the epitaxial features 142b, thereby improving frequency response of the RF transistor 101b.

In various embodiments, the epitaxial features 142b may be doped with a higher concentration of a dopant than the epitaxial features 142a. For example, when both the transistors 101a and 101b are NMOSFETs, the epitaxial features 142b may be doped with a higher concentration of phosphorus (P) or other suitable dopants than the epitaxial features 142a. For another example, when both the transistors 101a and 101b are PMOSFETs, the epitaxial features 142b may be doped with a higher concentration of boron (B) or other suitable dopants than the epitaxial features 142a. Having a higher dopant concentration increases the carrier mobility in the RF transistor 101b. In some embodiments, both the epitaxial features 142a and 142b include silicon germanium (e.g., both the transistors 101a and 101b are PMOSFETs), but the germanium concentration (relative to silicon) is higher in the epitaxial features 142b than in the epitaxial features 142a. For example, the epitaxial features 142a includes $Si_{1-x}Ge_x$ alloy and the epitaxial features 142a includes $Si_{1-y}Ge_y$ alloy, where x and y represent ratios in atomic numbers and x is smaller than y. This increases the stress to the channel region and increases carrier mobility in the RF transistor 101b.

Even though two transistors are shown in this embodiment, the device 100 may include any number of transistors configured in any number of device regions. Further, the device 100 may include other types of transistors in addition to FinFETs, such as planar transistors, gate all-around transistors, and nano-wire transistors. Still further, the device 100 may include passive components such as resistors, capacitors, and inductors, and active components such as p-type FETs (PFETs), n-type FETs (NFETs), metal-oxide semiconductor field effect transistors (MOSFET), complementary metal-oxide semiconductor (CMOS) transistors, bipolar transistors, high voltage transistors, high frequency transistors, static random access memory (SRAM), other memory cells, and combinations thereof. More details of the device 100 will be discussed below in conjunction with FIGS. 2A-3H which illustrate manufacturing steps for fabricating the device 100.

Figure 2A:
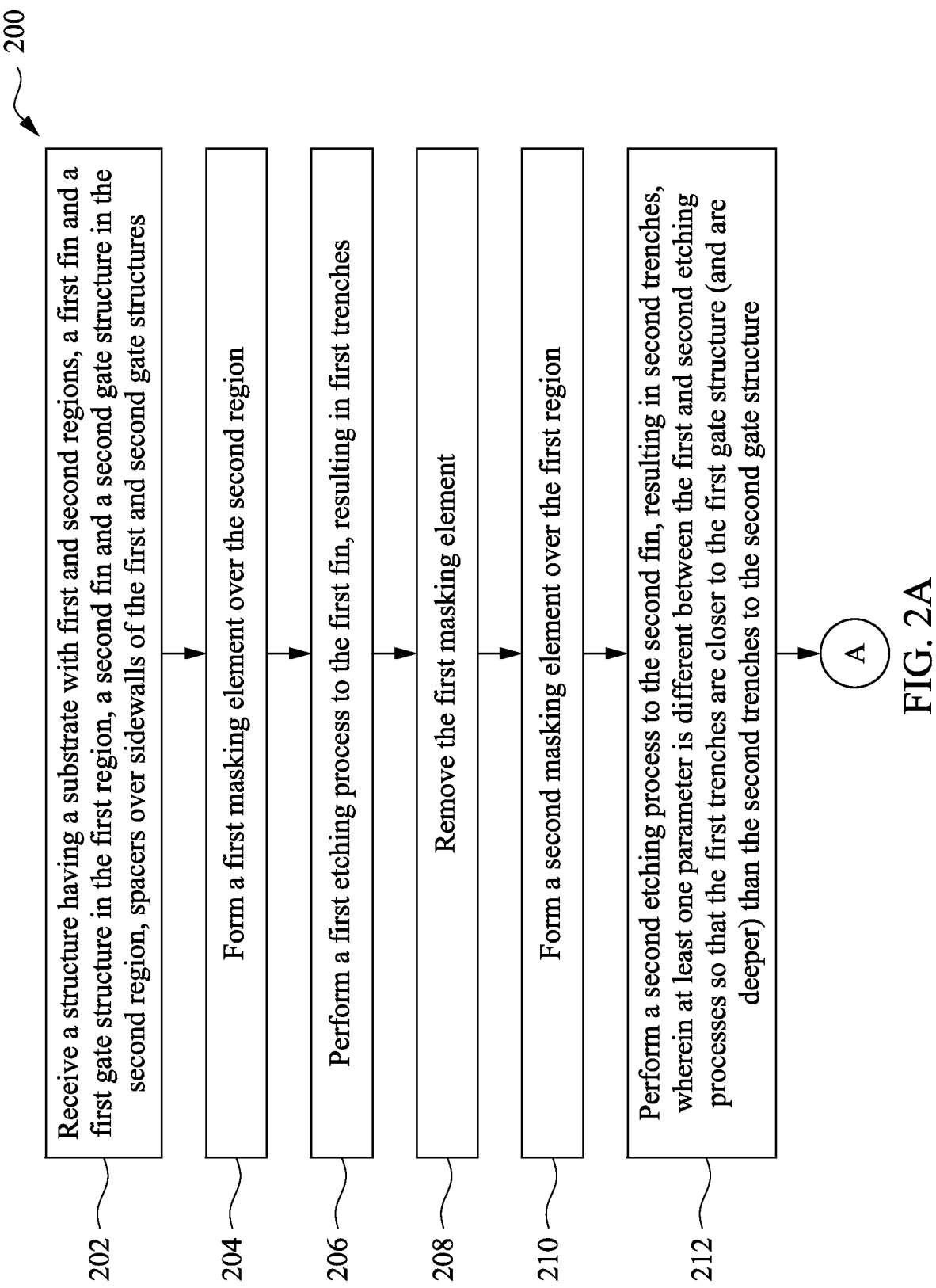
FIGS. 2A and 2B show a block diagram of a method of forming a semiconductor device, according to various aspects of the present disclosure.
Figure 2B:
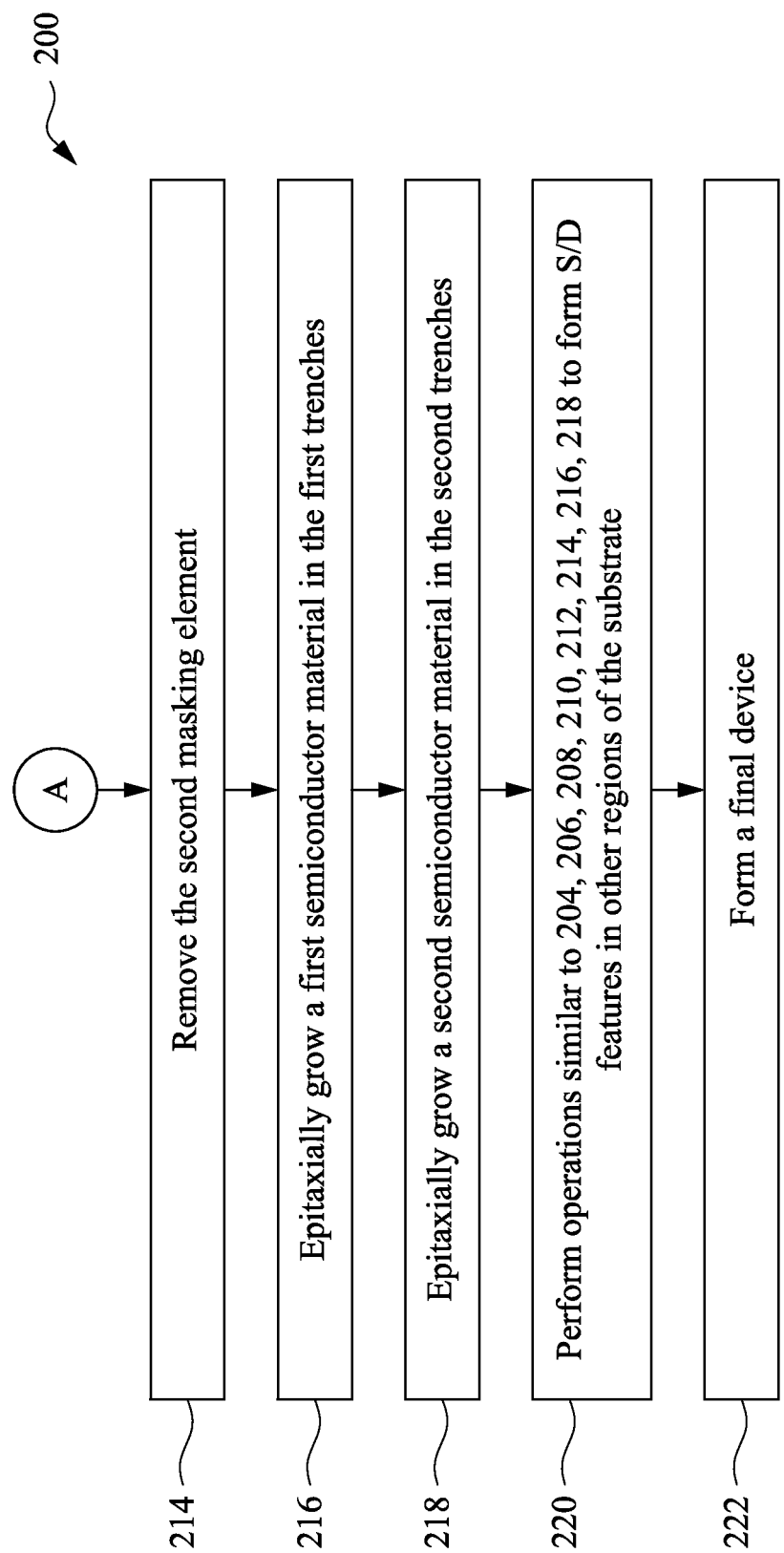

Referring to FIGS. 2A and 2B, shown therein is a method 200 of forming the semiconductor device 100 according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3A-3H which show perspective and cross-sectional views of the semiconductor device 100 according to various aspects of the present disclosure.

Figure 3A:
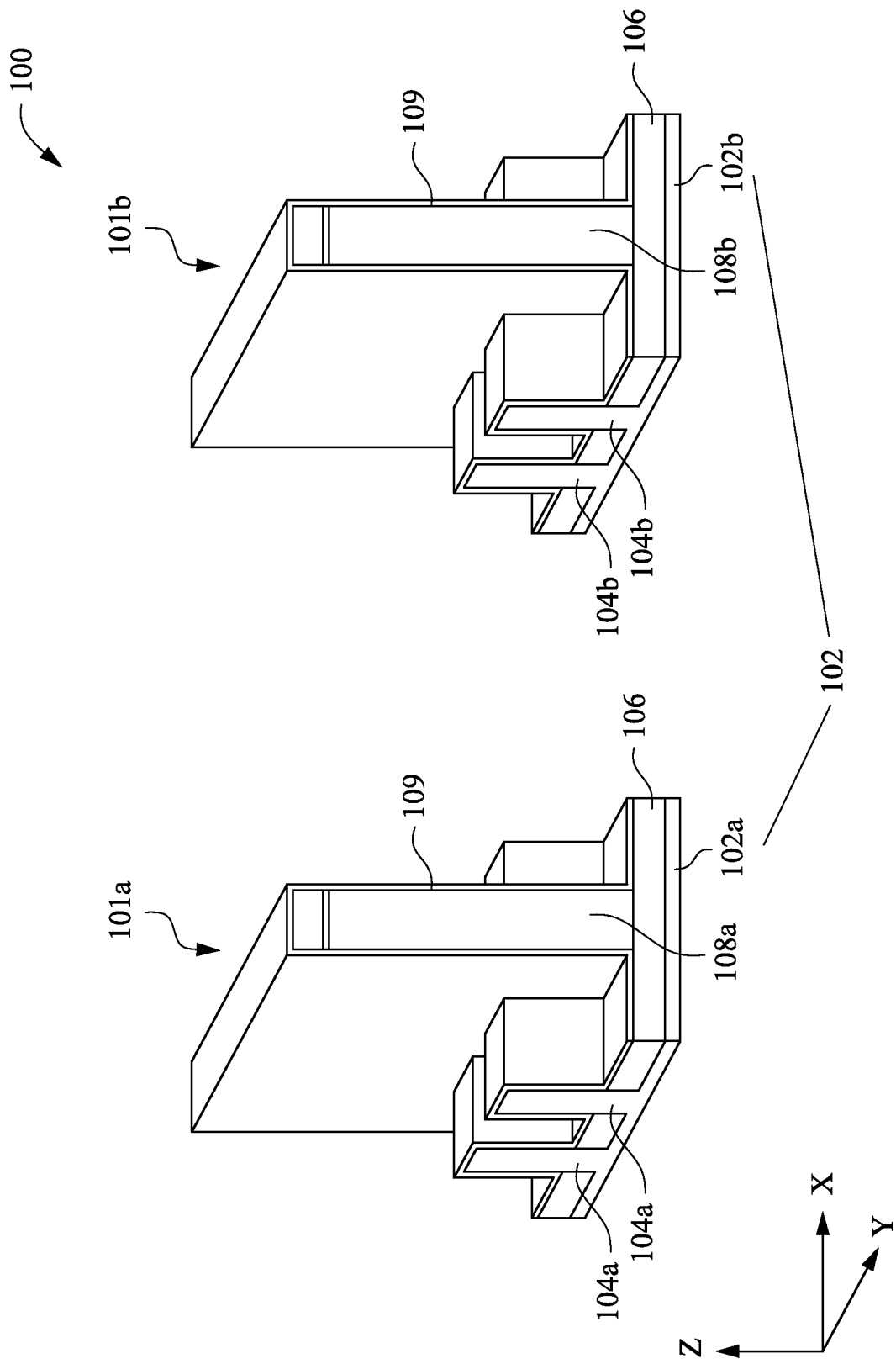
FIGS. 3A, 3B, 3C, 3D, 3E, and 3F illustrate perspective views of a semiconductor device, in portion, at various fabrication stages according to the method of FIGS. 2A and 2B, in accordance with some embodiments.

Referring to FIG. 2A, at operation 202, the method 200 receives or is provided with a workpiece of the semiconductor device (or semiconductor structure) 100. For the convenience of discussion, the workpiece is also referred to as the semiconductor structure 100. Referring to FIG. 3A, the semiconductor structure 100 includes a substrate 102 having a first region 102a and a second region 102b. Various components of the logic transistor 101a are fabricated in or over the first region 102a, and various components of the RF transistor 101b are fabricated in or over the second region 102b. The device 100 may include p-type logic FinFETs, n-type logic FinFETs, p-type RF FinFETs, and n-type RF FinFETs. For the sake of simplicity, the transistors 101a and 101b are assumed to be of the same type in the following discussion. In an embodiment, the transistors 101a and 101b are both p-type FinFETs. In another embodiment, the transistors 101a and 101b are both n-type FinFETs.

Over the first region 102a, the semiconductor structure 100 includes various semiconductor fins (or "fins") 104a (two shown) that are disposed side-by-side, and a gate structure 108a engaging the fins 104a over top and sidewalls thereof. Over the second region 102b, the semiconductor structure 100 includes various fins 104b (two shown) that are disposed side-by-side, and a gate structure 108b engaging the fins 104b over top and sidewalls thereof. In various embodiments, each of the transistors 101a and 101b may include any number of semiconductor fins, such as single fin, dual fin, triple fin, and so on. Further, the transistors 101a and 101b may include different number of fins.

The semiconductor structure 100 further includes an isolation structure 106 over the substrate 102. The fins 104a and 104b protrude out of the substrate 102 and through the isolation structure 106. The semiconductor structure 100 further includes one or more dielectric layers ("dielectric spacers") 109 disposed over top and sidewalls of the gate structures 108a and 108b and of the fins 104a and 104b. The various components of the semiconductor structure 100 are further described below.

The substrate 102 is a silicon substrate in the present embodiment. Alternatively, the substrate 102 may include another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI), such as a semiconductor substrate having a buried dielectric layer on which the fins 104a and 104b stand.

The semiconductor fins 104a and 104b may include one or more semiconductor materials such as silicon, germanium, or silicon germanium. In an embodiment, each of the semiconductor fins 104a and 104b may include multiple different semiconductor layers stacked one over the other. The semiconductor fins 104a and 104b may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 104a and 104b by etching initial epitaxial semiconductor layers of the substrate 102. The etching process can include dry etching, wet etching, reactive ion etching (RIE), and/or other suitable processes.

The isolation structure 106 may include silicon oxide, silicon nitride, silicon oxynitride, fluoride-doped silicate glass (FSG), a low-k dielectric material, air gap, and/or other suitable insulating material. The isolation structure 106 may be a shallow-trench-isolation (STI), field oxide, LOCal Oxidation of Silicon (LOCOS), and/or other suitable structures. The isolation structure 106 may include a multi-layer structure, for example, having one or more thermal oxide liner layers. In an embodiment, the isolation structure 106 is formed by etching trenches in the substrate 102, e.g., as part of the fins 104a and 104b formation process. The trenches may then be filled with isolating material, followed by a chemical mechanical planarization (CMP) process and/or an etch-back process. The isolating material may be deposited by any suitable deposition techniques including chemical vapor deposition (CVD), plasma enhanced CVD (PECVD), and flowable CVD (FCVD).

Each of the gate structures 108a and 108b may include a gate dielectric layer, a gate electrode layer, and a hard mask layer, one over the other in that order. The gate structures 108a and 108b may include one or more additional layers. In an embodiment, the gate structures 108a and 108b are sacrificial gate structures, i.e., placeholders for final gate structures (or gate stacks). The gate dielectric layer may include a dielectric material such as silicon oxide, and may be formed by chemical oxidation, thermal oxidation, atomic layer deposition (ALD), CVD, and/or other suitable methods. The gate electrode layer may include polycrystalline silicon (polysilicon) or amorphous silicon, and may be formed by suitable deposition processes such as low-pressure CVD (LPCVD) and PECVD. The hard mask layer may include one or more layers of silicon nitride or silicon oxide, and may be formed by CVD, physical vapor deposition (PVD), or other suitable deposition techniques. In an embodiment, the various layers of the gate structure 108a and 108b are first deposited as blanket layers over the isolation structure 106 and the fins 104a and 104b. Then the blanket layers are patterned through a process including photolithography processes and etching processes thereby removing portions of the blanket layers and keeping the remaining portions as the gate structures 108a and 108b.

The dielectric spacers 109 may include one or more layers of dielectric materials, such as silicon oxide, silicon nitride, silicon oxynitride, silicon carbon nitride, a low-k nitride, or a combination thereof. For example, the dielectric spacers 109 may include a silicon nitride layer over a silicon oxide layer. In an embodiment, the dielectric spacers 109 have a thickness in a range from about 2 to about 10 nm. The dielectric spacers 109 may be deposited using CVD, ALD, or other suitable methods.

Figure 3B:
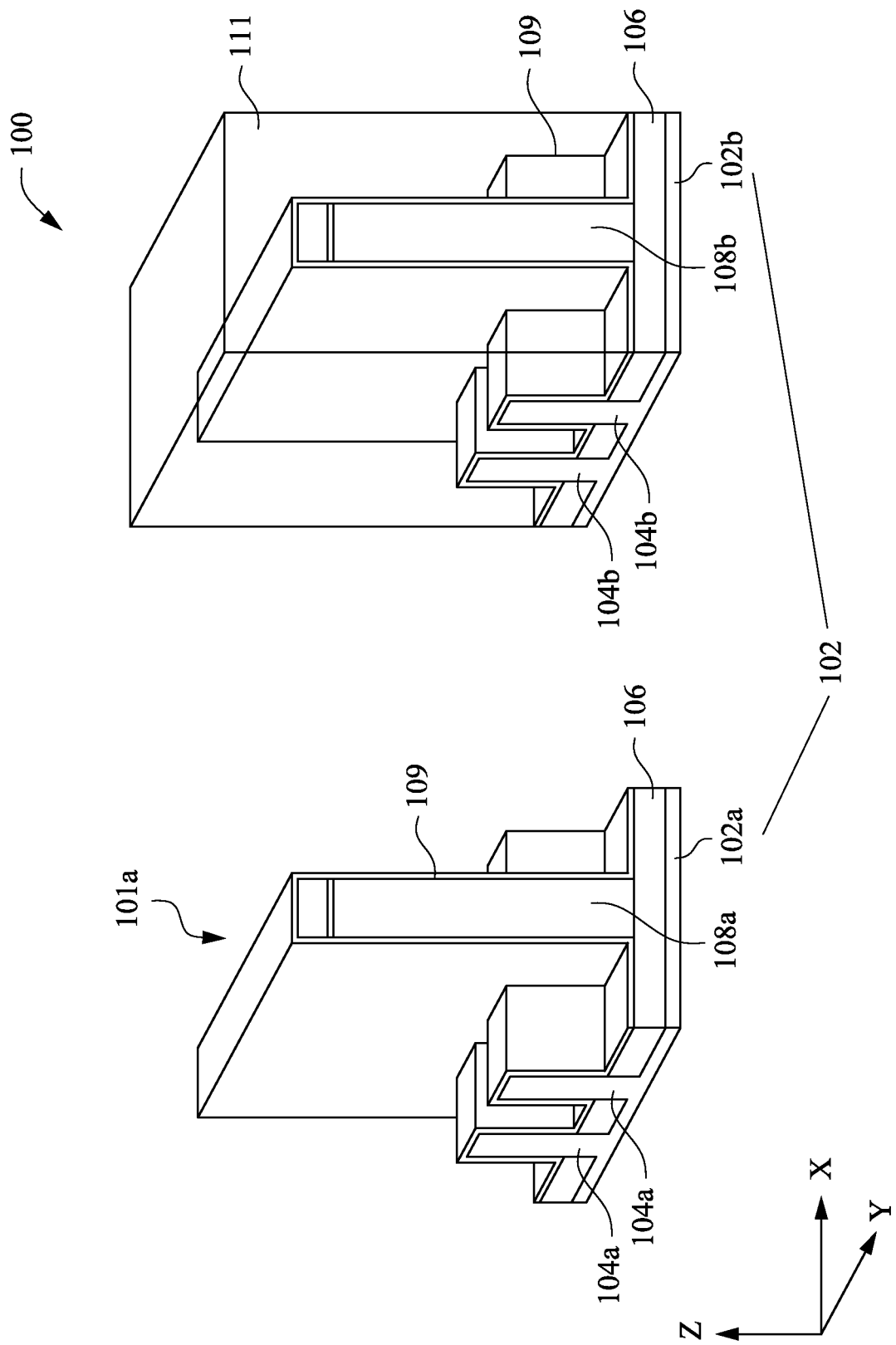

At operation 204, the method 200 (FIG. 2A) forms a first masking element 111 over the second region 102b. Referring to FIG. 3B, in an embodiment, the first masking element 111 includes a photoresist patterned by a photolithography process. The photolithography process may include coating a photoresist (or resist) layer over the substrate 102; exposing the resist layer to a pattern, performing post-exposure baking; and developing the resist layer to form a patterned resist layer. In a further embodiment, the first masking element 111 includes a bottom antireflective coating (BARC) layer and a resist layer over the BARC layer. The resist layer is patterned using a photolithography process as discussed above, and the BARC layer is subsequently etched (e.g., by dry etching, wet etching, or other etching methods) using the patterned resist layer as an etch mask. The patterned BARC layer and resist layer become part of the first masking element 111. In an embodiment, the first masking element 111 covers every part of the semiconductor structure 100 except those regions for fabricating a particular type of logic devices, such as n-type logic devices or p-type logic devices, including the logic transistor 101a.

Figure 3C:
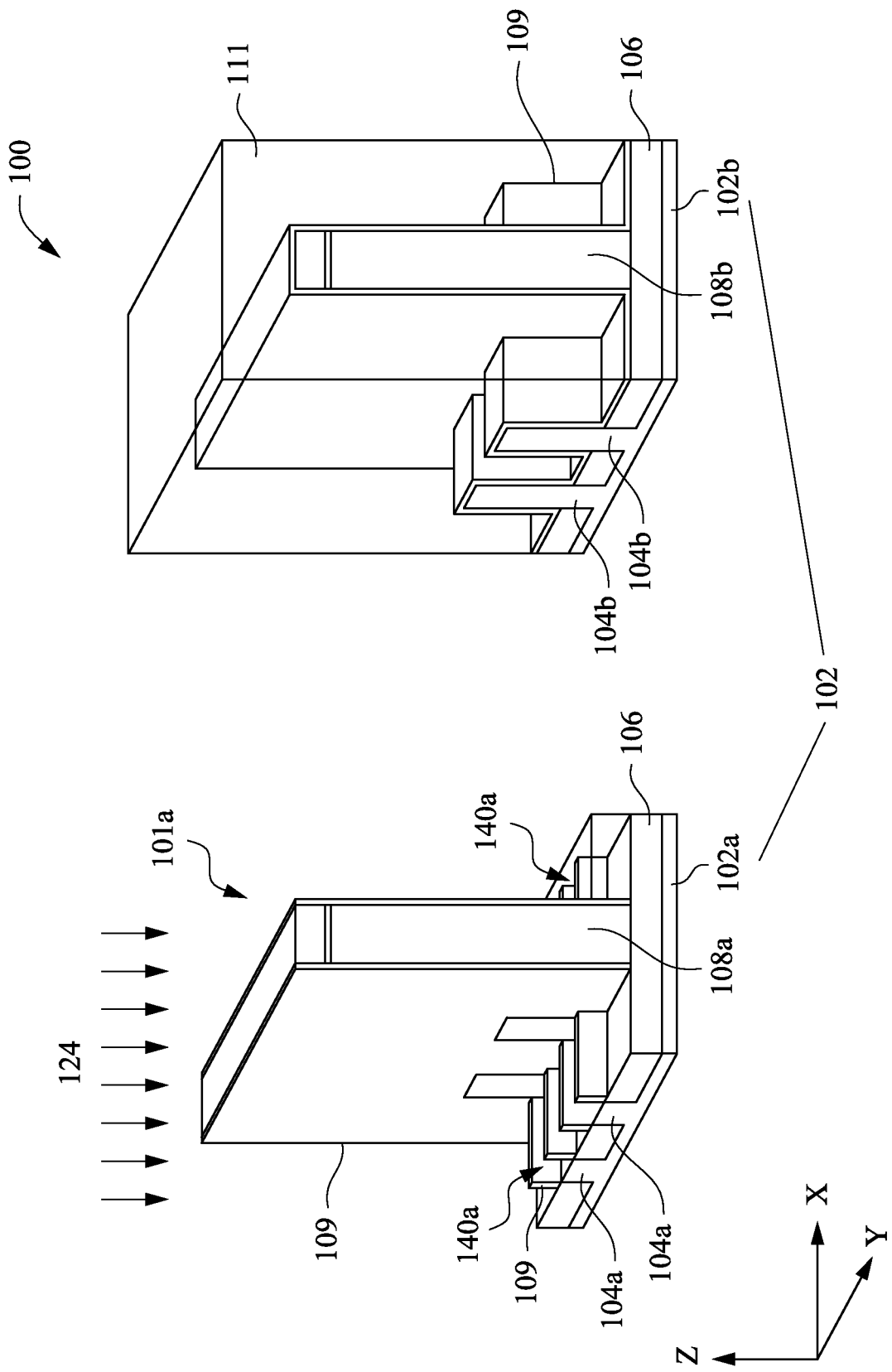

At operation 206, the method 200 (FIG. 2A) performs a first etching process 124 to the semiconductor structure 100 while the first masking element 111 is in place (FIG. 3C). In the present embodiment, the first etching process 124 is applied to all n-type logic devices or all p-type logic devices, but not both. The first etching process 124 may include one or more steps. For example, a first step may be tuned to remove the dielectric spacers 109 from the top surfaces of the gate structures 108a, the fins 104a, and the isolation structure 106; and a second step may be tuned to recess the fins 104a to form recesses 140a. In an embodiment, the first etching process 124 includes a dry etching process that may implement an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As a result of the operation 206, the dielectric spacers 109 are partially removed, with some portions remaining on the sidewalls of the gate structure 108a, which become gate spacers 109. Also, in the present embodiment, some portions of the dielectric spacers 109 that are on lower sidewalls of the fins 104a (see FIGS. 3B and 3C) remain and become fin sidewall (FSW) spacers 109. In some embodiments, the portions of the dielectric spacers 109 that are on sidewalls of the fins 104a may be completely removed. In the present embodiment, the first etching process 124 is tuned (e.g., by adjusting etching chemical(s), duration, temperature, pressure, bias, etc.) such that the fins 104a are recessed below the top surface of the isolation structure 106 along the Z direction and are recessed laterally along the X direction, thereby extending the recesses 140a under the gate spacers 109. The first etching process 124 is designed to produce the recesses 140a to have characteristics (e.g., depth, width, and shape) suitable for growing epitaxial S/D features 142a as shown in FIG. 1 for the logic transistor 101a. More aspects of the first etching process 124 and the recesses 140a are further described after operation 214 (FIG. 2B).

Figure 3D:
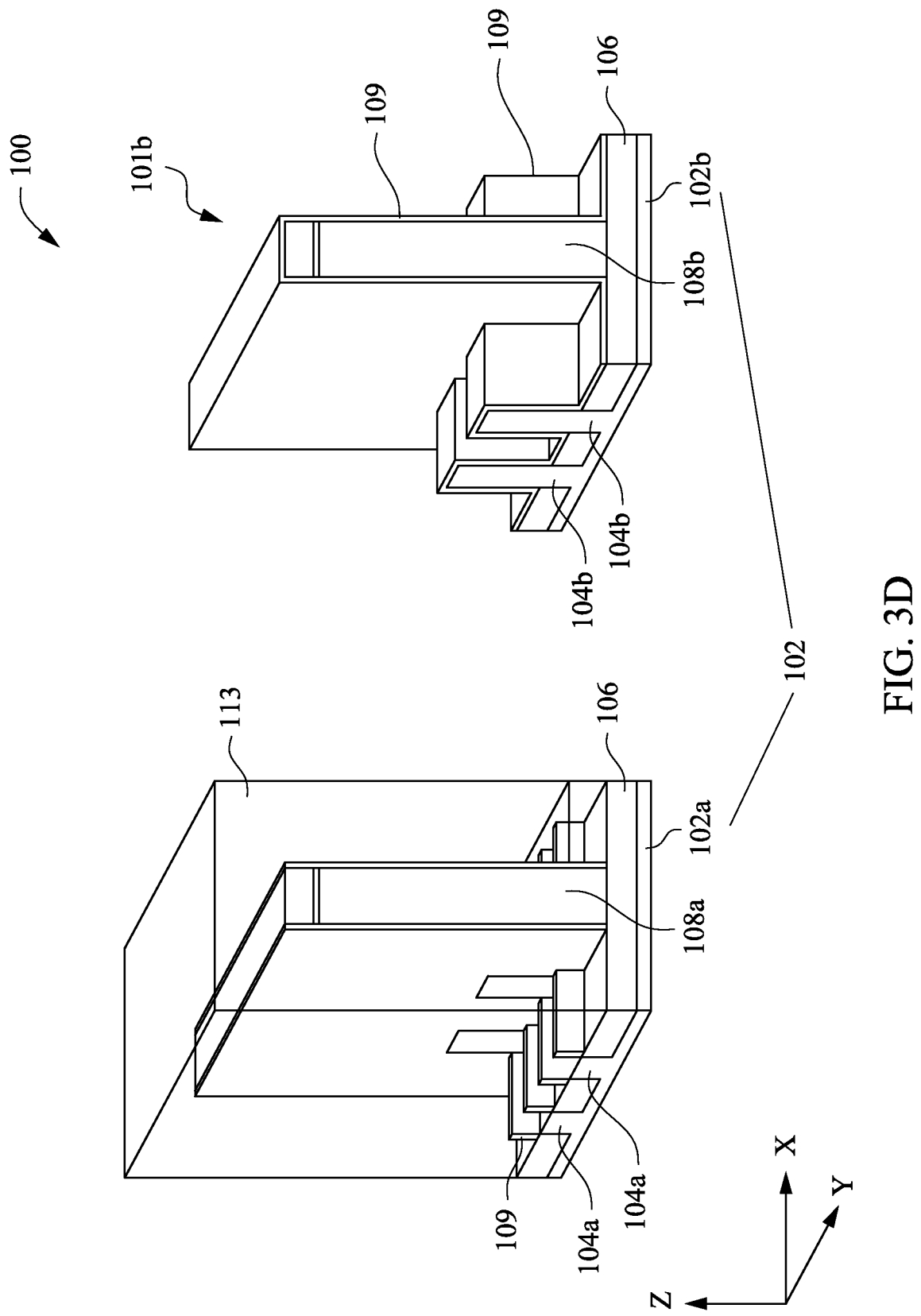

At operation 208, the method 200 (FIG. 2A) removes the first masking element 111, for example, by resist stripping or ashing or other suitable methods. At operation 210, the method 200 (FIG. 2A) forms a second masking element 113 over the first region 102a. Referring to FIG. 3D, in an embodiment, the second masking element 113 includes a photoresist patterned by a photolithography process. In a further embodiment, the second masking element 113 includes a BARC layer under the resist layer. The method of forming the second masking element 113 is similar to that of forming the first masking element 111. In an embodiment, the second masking element 113 covers every part of the semiconductor structure 100 except those regions for fabricating a particular type of RF devices, such as n-type RF devices or p-type RF devices, including the RF transistor 101b. Particularly, the type of RF devices (either n-type or p-type) is the same as the type of logic devices (either n-type or p-type) that is exposed by the first masking element 111 (see the operation 204).

Figure 3E:
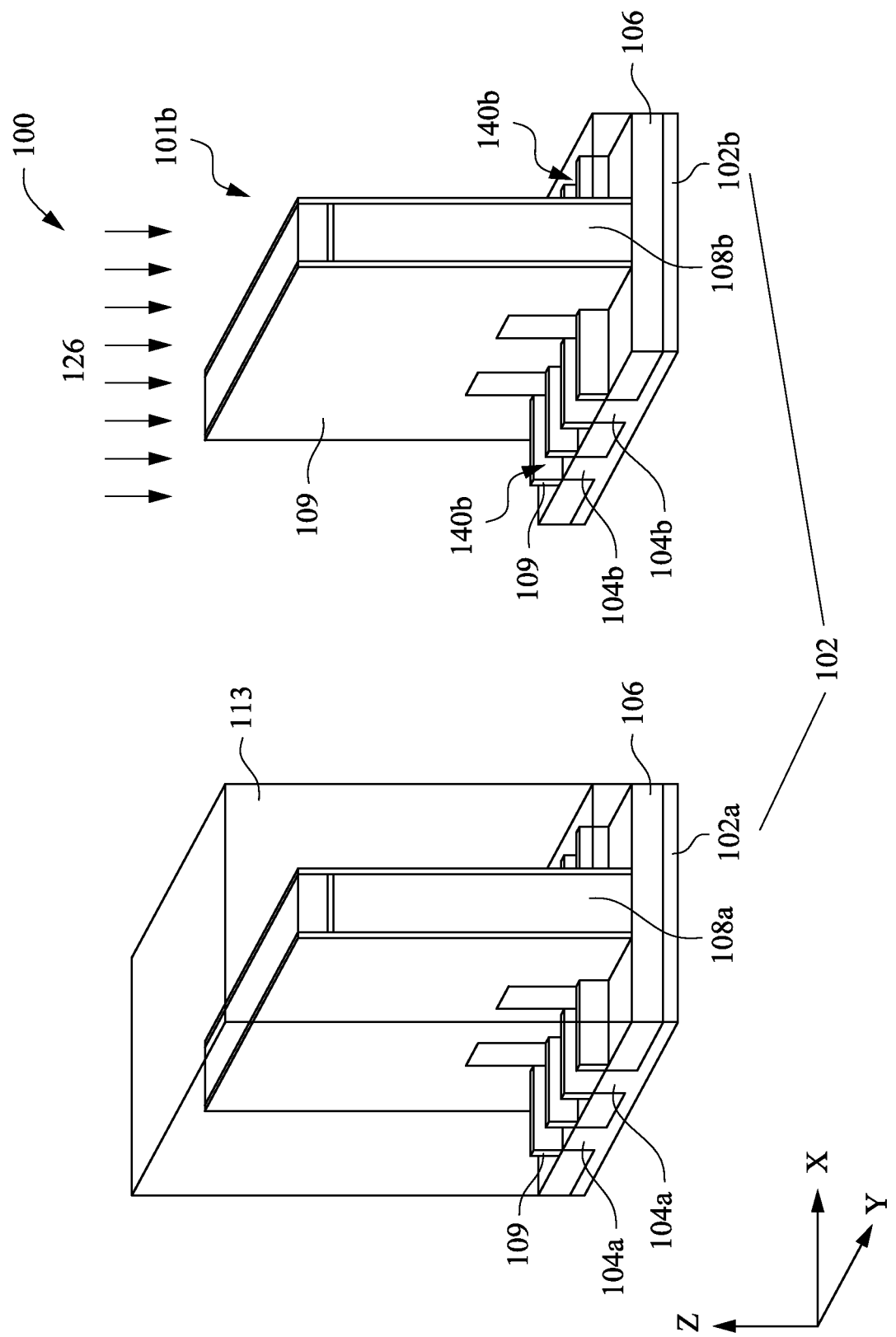
Figure 3F:
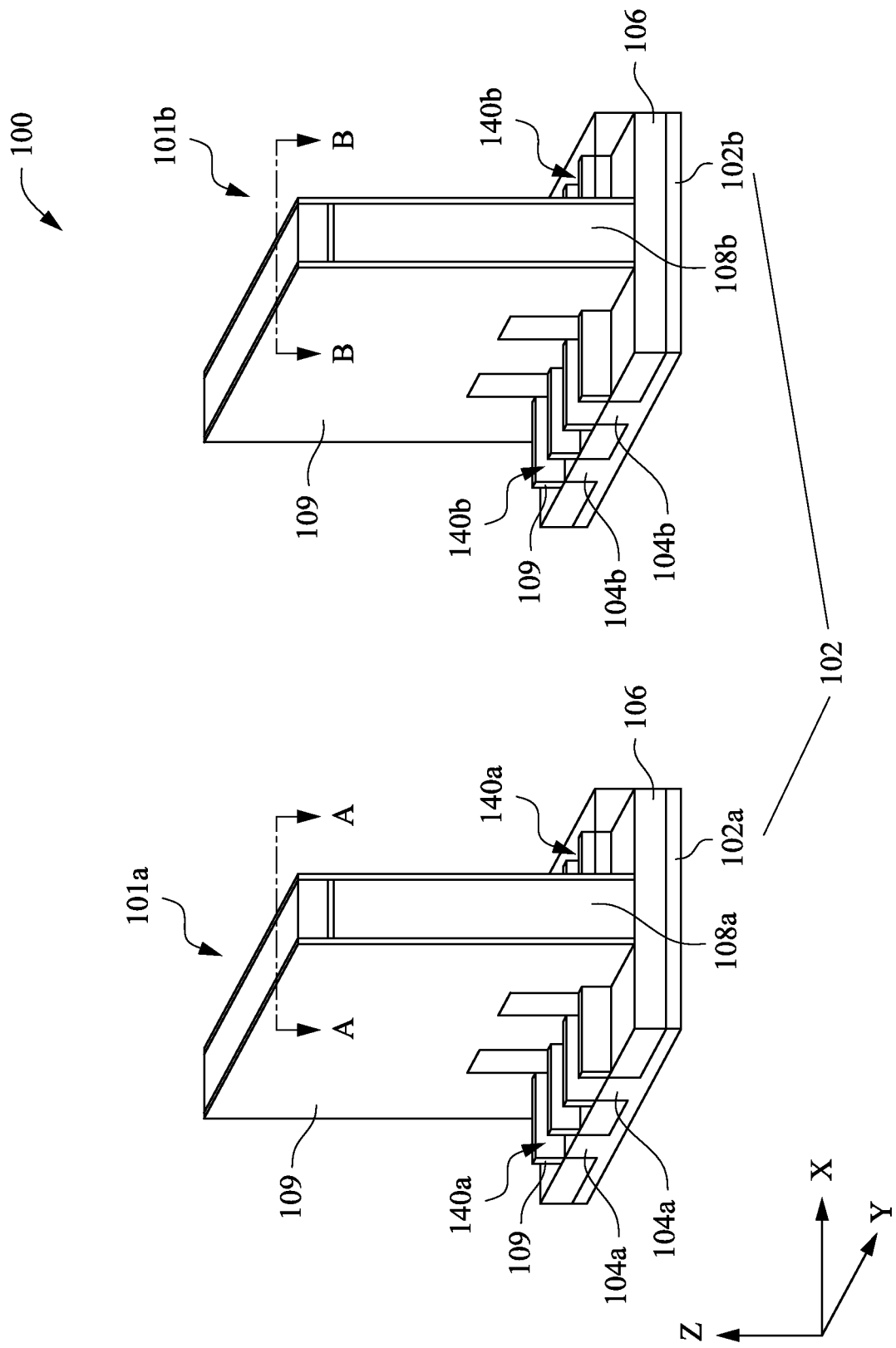

At operation 212, the method 200 (FIG. 2A) performs a second etching process 126 to the semiconductor structure 100 while the second masking element 113 is in place (FIG. 3E). In the present embodiment, the second etching process 126 is applied to all n-type RF devices or all p-type RF devices, but not both. The second etching process 126 may include one or more steps. For example, a first step may be tuned to remove the dielectric spacers 109 from the top surfaces of the gate structures 108b, the fins 104b, and the isolation structure 106; and a second step may be tuned to recess the fins 104b to form recesses 140b. In an embodiment, the second etching process 126 includes a dry etching process that may implement an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. As a result of the operation 212, the dielectric spacers 109 are partially removed, with some portions remaining on the sidewalls of the gate structure 108b, which become gate spacers 109. Also, in the present embodiment, some portions of the dielectric spacers 109 that are on lower sidewalls of the fins 104b (see FIGS. 3D and 3E) remain and become fin sidewall (FSW) spacers 109. In some embodiments, the portions of the dielectric spacers 109 that are on sidewalls of the fins 104a may be completely removed.

Figure 3G:
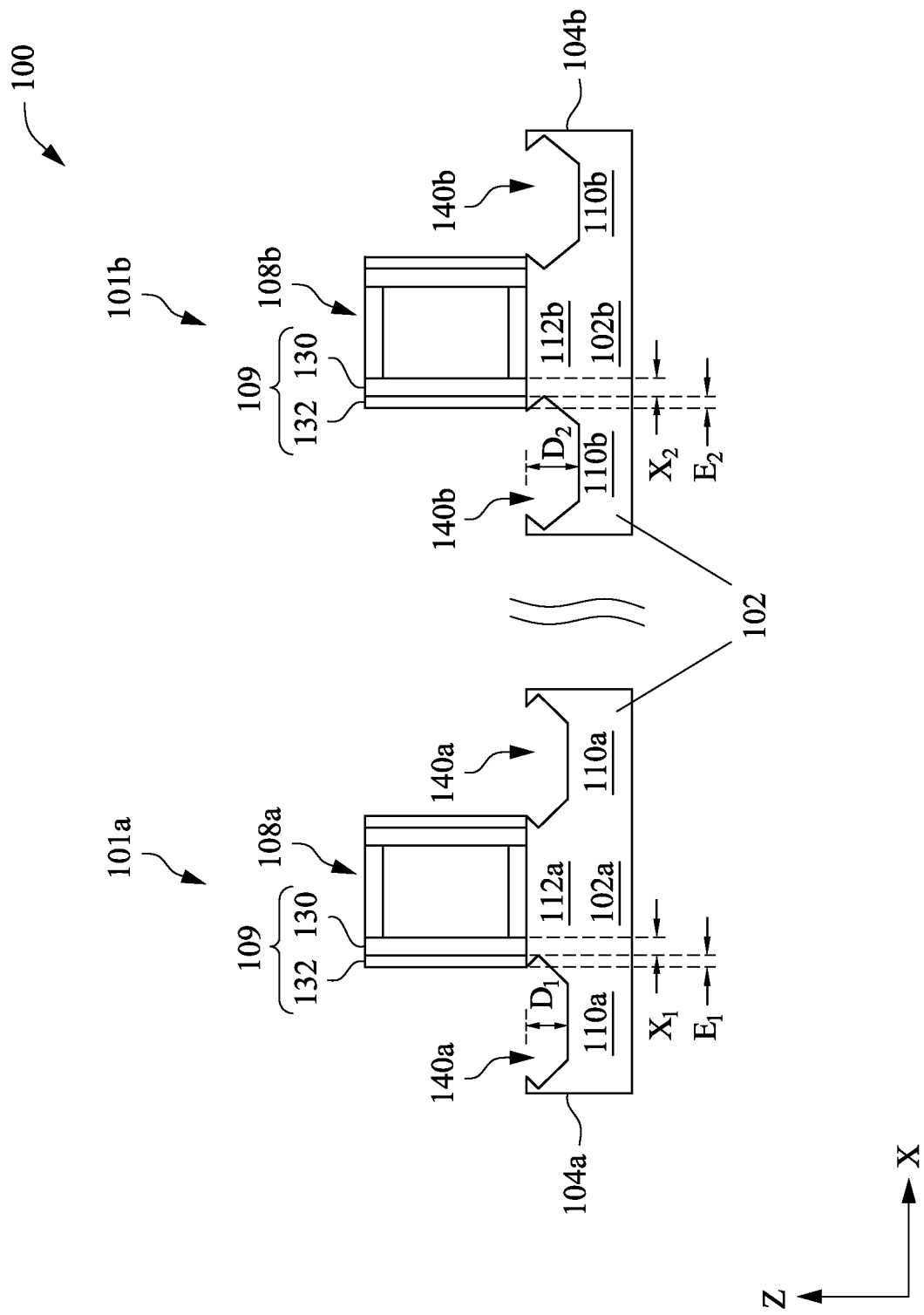
FIGS. 3G and 3H illustrate cross-sectional views of a semiconductor device, in portion, at some fabrication stages according to the method of FIGS. 2A and 2B, in accordance with some embodiments.

In the present embodiment, the second etching process 126 is tuned to differ from the first etching process 124 (such as isotropy/anisotropy, etching duration, etching temperature, etching bias, etching power, etching pressure, a concentration of an etching chemical, or a ratio among etching chemicals) such that the recesses 140b have different characteristics (e.g., depth, width, or shapes) than the recesses 140a (see FIG. 3G). Particularly, the recesses 140b extend under the gate spacers 109 for a shorter distance than the recesses 140a do ($E_2 < E_1$ and X2>X1 in FIG. 3G). In some embodiments, the recesses 140b may be etched shallower than or about same depth as the recesses 140a. In a particular embodiment, the recesses 140b are etched deeper than the recesses 140a ($D_2 > D_1$ in FIG. 3G)) so that the epitaxial features 142b may extend deeper into the fins 104b than the epitaxial features 142a extend into the fins 104a (see FIG. 1). For example, deeper epitaxial features 142b increase conducting area for the transistor fin, thereby increasing the drivability of the transistor 101b. For example, D2 may be greater than D1 by 20% to 80%. In other words, D2:D1 may range from 1.2:1 to 1.8:1 in some embodiments. If the ratio is smaller than this range, then the benefits of increased drivability of the transistor 101b diminishes. If the ratio is bigger than this range, which means D1 is too small, then the transistor 101a may suffer from degraded performance. In various embodiments, the difference between the depths of the recesses 140a and 140b and the difference between the widths of the recesses 140a and 140b (therefore proximity to the gates 108a and 108b respectively) can be separately controlled by tuning the etching processes 124 and 126. For example, each of the etching processes 124 and 126 may utilize a physical etching (e.g., anisotropic etching using HBr or other suitable etchants) to control the difference in the recess depths $D_1$ and $D_2$. Also, each of the etching processes 124 and 126 may utilize a chemical etching (e.g., isotropic etching using an etchant having $NF_3$, $F_2$, $Cl_2$, or other suitable chemicals) to control the difference in the recess proximity $X_1$ and $X_2$.

Further, in the physical etching and chemical etching, some parameters such as etching duration, etching temperature, etching bias, etching power, etching pressure, concentration of etching chemicals, or a ratio among etching chemicals can be further tuned to create desired depth and proximity profiles in the recesses 140a and 140b. For example, in physical etching, using longer etching duration, higher etching temperature, higher etching bias, higher etching power, higher etching pressure, or a combination thereof results in deeper recesses. For example, in chemical etching, using longer etching duration, higher etching temperature, higher etching pressure, higher concentration of etching chemical, or a combination thereof results in wider recesses. In embodiments, the concentration of the etching chemical may be tuned by adjusting etching chemical gas flow rate(s) and/or the inert carrier gas flow rate(s) into the etching chamber. In another embodiment where each of the first and second etching processes 124 and 126 is performed with a mixture of etching chemical gases, the ratio of etching chemical gases in the mixture may be tuned differently for the two etching processes so that the etching rates of the two etching processes are different.

In some embodiments, the first and second etching processes 124 and 126 are tuned to differ in only one parameter that is one of: etching duration, etching bias, etching temperature, etching power, a concentration of an etching chemical, and a ratio among etching chemicals, while all other parameters are the same between the two etching processes. This may make it easier to control the difference between the recesses 140a and 140b. In alternative embodiments, the first and second etching processes 124 and 126 are tuned to differ in a combination of two or more parameters selected from, but not restricted to, etching duration, etching bias, etching temperature, etching power, a concentration of an etching chemical, and a ratio among etching chemicals. The first and second etching processes 124 and 126 may be performed in the same process chamber with different etching recipes. Alternatively, they may be performed in different etching chambers.

At operation 214, the method 200 (FIG. 2B) removes the second masking element 113 (FIG. 3F) by resist stripping or ashing or other suitable methods. In an embodiment, the operation 214 may perform a cleaning process to the recesses 140a and 140b to make them ready for epitaxial growth. FIG. 3G illustrate cross-sectional views of the semiconductor structure 100 at this fabrication stage along the A-A and B-B lines of FIG. 3F, which cut the fins 104a and 104b along the X direction. Referring to FIG. 3G, the recesses 140a are etched into the S/D regions 110a of the fins 104a, and the recesses 140b are etched into the S/D regions 110b of the fins 104b. The gate structure 108a engages the channel regions 112a of the fins 104a. The gate structure 108b engages the channel regions 112b of the fins 104b. The gate spacers 109 include a seal spacer 130 (e.g., silicon oxide) and a main spacer 132 (e.g., silicon nitride) in the present embodiment. Each of the recesses 140a and 140b may extend directly under the main spacer 132 but not the seal spacer, or may extend directly under both the main spacer 132 and the seal spacer 130.

The recesses 140a have a depth $D_1$ (as measured from the top surface of the fin 104a to the bottom surface of the recess 140a), and the recesses 140b have a depth $D_2$ (as measured from the top surface of the fin 104b to the bottom surface of the recess 140b). In some embodiments, $D_1$ is greater than or about equal to $D_2$. In the present embodiment, $D_1$ is smaller than $D_2$. Further, the distance $X_1$ between the recesses 140a and the gate structure 108a (as measured from the vertical extension of a side of the gate structure 108a to the nearest surface of the recesses 140a along the X direction) is smaller than the distance $X_2$ between the recesses 140b and the gate structure 108b (as measured from the vertical extension of a side of the gate structure 108b to the nearest surface of the recesses 140b along the X direction). In an embodiment, a ratio between $X_1$ and $X_2$ is in the range from 1:1.2 to 1:3, such as from 1:2 to 1:3. Still further, the recesses 140a extend under the gate spacer 109 for a distance $E_1$ (as measured from the vertical extension of a side of the gate spacer 109 to the nearest surface of the recesses 140a along the X direction), and the recesses 140b extend under the gate spacer 109 for a distance $E_2$ (as measured from the vertical extension of a side of the gate spacer 109 to the nearest surface of the recesses 140b along the X direction). In the present embodiment, $E_1$ is greater than $E_2$. The differences between the dimensions of the recesses 140a and 140b may be controlled by tuning the first and second etching processes 124 and 126 as discussed above. In the above embodiment, the recesses 140a are etched before the recesses 140b. Alternatively, the recesses 140b may be etched before the recesses 140a. In other words, the etching processes 124 and 126 may be performed in any order.

Figure 3H:
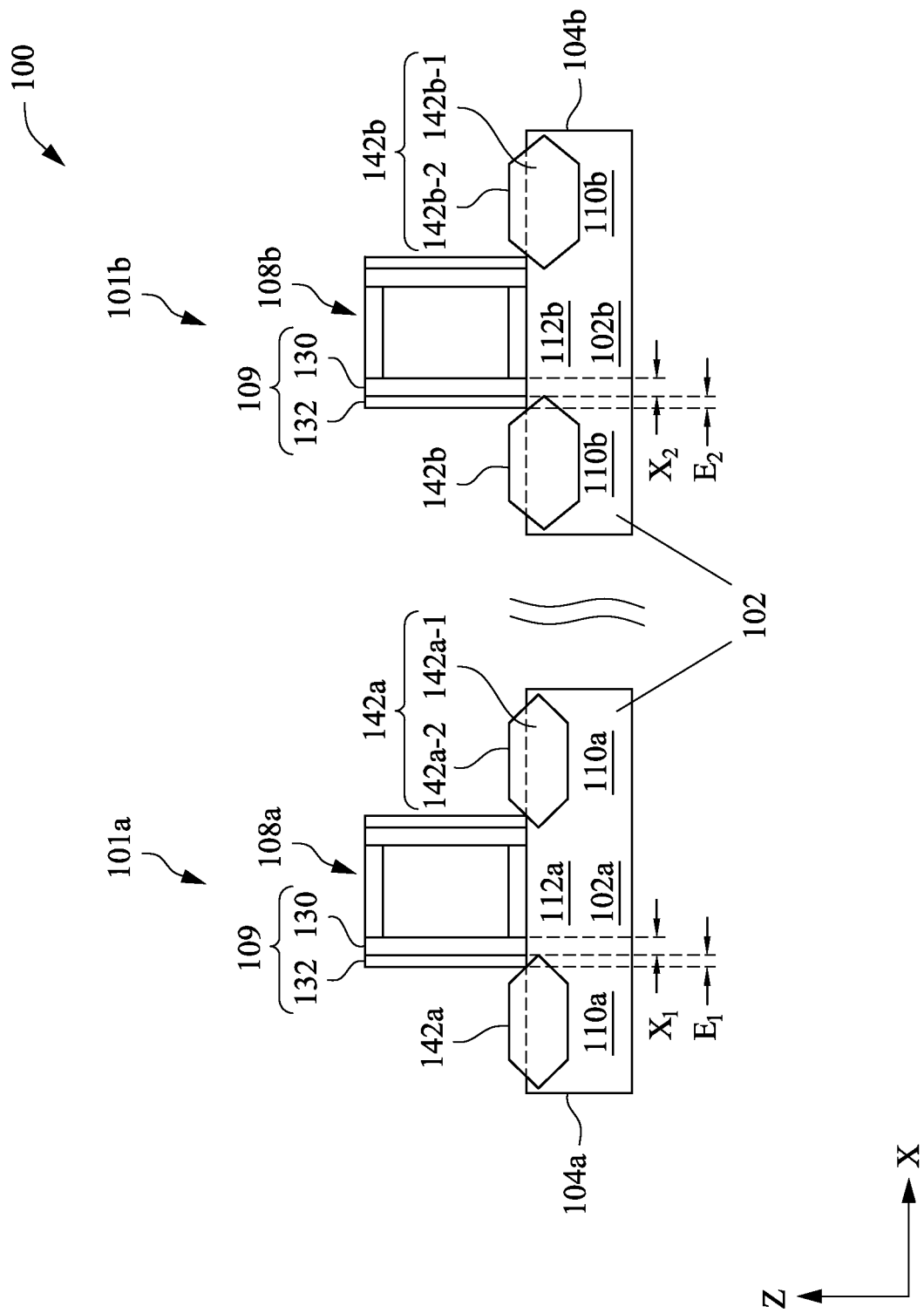

At operation 216, the method 200 (FIG. 2B) epitaxially grows a first semiconductor material 142a in the recesses 140a (FIG. 3H). At operation 218, the method 200 (FIG. 2B) epitaxially grows a second semiconductor material 142b in the recesses 140b (FIG. 3H). The semiconductor materials 142a and 142b are the epitaxial S/D features for the transistors 101a and 101b, respectively. In an embodiment, the operations 216 and 218 may be performed simultaneously by growing the same semiconductor material in the recesses 140a and 140b. This saves production time. In an alternative embodiment, the operations 216 and 218 may be performed separately. For example, the operation 216 may be performed after the operation 206 but before the operation 208, while the operation 218 may be performed after the operation 212 but before the operation 214. Performing the operations 216 and 218 separately allows different semiconductor materials to be epitaxially grown for the S/D features 142a and 142b for the purpose of separately tuning the performance of logic devices and RF devices. Of course, the semiconductor materials of the S/D features 142a and 142b can still be the same even if the operations 216 and 218 are performed separately. Due to the difference in the recesses 140a and 140b as discussed above, the S/D features 142b are embedded deeper in the fin 104b than the S/D features 142a are embedded in the fin 104a in the present embodiment ($D_2 > D_1$). Further, the S/D features 142a are closer to the respective gate structure 108a (with a distance $X_1$) than the S/D features 142b are relative to the respective gate structure 108b (with a distance $X_2$). Still further, each of the S/D features 142a and 142b are grown out of the respective recesses 140 and 140b and raised above the respective fins 104a and 104b. For example, each S/D feature 142a has a portion 142a-1 embedded in the fin 104a and another portion 142a-2 raised above the fin 104a. Similarly, each S/D feature 142b has a portion 142b-1 embedded in the fin 104b and another portion 142b-2 raised above the fin 104b. In an embodiment, the operations 216 and 218 are controlled such that the S/D portion 142b-2 has a smaller volume than the S/D portion 142a-2. Having a smaller volume in the raised portion 142b-2 reduces the coupling capacitance between the S/D features 142b and the gate 108b. In some examples, the operations 216 and 218 may control the epitaxial growth parameters (e.g., growth time, growth precursors, growth pressure etc.) to create the different volumes in the raised portions 142a and 142b.

In an embodiment, the epitaxial growth processes in the operations 216 and 218 may be a low pressure chemical vapor deposition (LPCVD) process using a silicon-based precursor gas. Further, the epitaxial growth process may in-situ dope the grown S/D features 142a and 142b with an n-type dopant such as P, As, or combinations thereof for forming the S/D features for n-type FinFETs or with a p-type dopant such as B for forming the S/D features for p-type FinFETs. In an embodiment, the S/D features 142b are doped with a higher concentration of the dopant than the S/D features 142a so that the RF transistor 101b provides higher carrier mobility. In some examples, for p-type FinFETs, the S/D features 142a and 142b may include silicon germanium, germanium or a combination. In an embodiment, both the S/D features 142a and 142b include silicon germanium, but the S/D features 142b have a higher germanium to silicon ratio than the S/D features 142a. For n-type FinFETs, the S/D features 142a and 142b may include silicon carbon, silicon, or a combination.

At operation 220, the method 200 (FIG. 2B) performs operations similar to the operations 204, 206, 208, 210, 212, 214, 216, and 218 to form S/D features in other regions of the substrate 102. In an embodiment, the transistors 101a and 101b are both n-type FinFETs. To further this embodiment, the operation 220 performs fabrications discussed above with reference to the operations 204-218 to form p-type FinFETs in the device structure 100. In another embodiment, the transistors 101a and 101b are both p-type FinFETs. To further this embodiment, the operation 220 performs fabrications discussed above with reference to the operations 204-218 to form n-type FinFETs in the device structure 100.

At operation 222, the method 200 (FIG. 2B) performs further steps to fabricate a final IC device including both RF and logic transistors. In an embodiment, the method 200 replaces the gate structure 108a and 108b with high-k metal gate stacks 128a and 128b, respectively. Referring to FIG. 1, an inter-layer dielectric (ILD) layer 144 is formed over the substrate 102 (not shown in FIG. 1, but see FIG. 3H) by a procedure, such as deposition and CMP. In an embodiment, the ILD layer 144 is formed by a flowable CVD (FCVD) process. The FCVD process includes depositing a flowable material (such as a liquid compound) on the substrate 102 to fill the gaps between the various structures (including the fins 104a-b, the gate structures 108a-b, and the gate spacers 109) and converting the flowable material to a solid material by a suitable technique, such as annealing in one example. Then, a CMP process is performed to the ILD layer 144 to expose the gate structures 108a-b. Subsequently, the gate structures 108a-b are removed by one or more selective etching processes thereby forming openings surrounded by the gate spacers 109 and the ILD 144. Subsequently, one or more material layers are deposited into the openings to form high-k metal gates 128a and 128b.

Each of the gate structures 128a and 128b may include an interfacial layer, a high-k dielectric layer, a work function metal layer, and a metal fill layer. The interfacial layer may include a dielectric material such as silicon oxide or silicon oxynitride, and may be formed by chemical oxidation, thermal oxidation, ALD, CVD, and/or other suitable dielectric. The high-k dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The dielectric layer may be formed by ALD and/or other suitable methods. The work function metal layer may be an n-type work function layer for n-type FinFETs or a p-type work function layer for p-type FinFETs, and may be deposited by CVD, PVD, and/or other suitable process. The p-type work function layer comprises a metal selected from but not limited to the group of titanium nitride (TiN), tantalum nitride (TaN), ruthenium (Ru), molybdenum (Mo), tungsten (W), platinum (Pt), or combinations thereof. The n-type work function layer comprises a metal selected from but not limited to the group of titanium (Ti), aluminum (Al), tantalum carbide (TaC), tantalum carbide nitride (TaCN), tantalum silicon nitride (TaSiN), or combinations thereof. The metal fill layer may include aluminum (Al), tungsten (W), or copper (Cu) and/or other suitable materials, and may be formed by CVD, PVD, plating, and/or other suitable processes. Further processes, such as contact and via formation, interconnect processing, etc., may be performed subsequently to complete the fabrication of the semiconductor structure 100.

Although not intended to be limiting, one or more embodiments of the present disclosure provide many benefits to a semiconductor device and the formation thereof. For example, embodiments of the present disclosure provide methods of forming raised epitaxial S/D features for both logic transistors and RF transistors in the same IC, and for controlling proximity of the epitaxial S/D features to nearby gate structures. Particularly, a ratio between the proximity in logic transistors to the proximity in RF transistors is disclosed, which improves frequency response for RF transistors while enhancing integration for logic transistors. Fabrication methods according to embodiments of the present disclosure can be readily integrated into existing manufacturing flow.

In one exemplary aspect, the present disclosure is directed to a method performed to a structure that includes a substrate with a first region configured for logic devices and a second region configured for radio frequency (RF) devices, a first fin over the first region, a first gate structure engaging the first fin, a second fin over the second region, a second gate structure engaging the second fin, and gate spacers over sidewalls of the first and second gate structures. The method includes forming a first masking element exposing portions of the first fin and covering the second region; performing a first etching process to the first fin, thereby resulting in a first recess proximate the first gate structure; removing the first masking element; forming a second masking element exposing portions of the second fin and covering the first region; and performing a second etching process to the second fin, resulting in a second recess proximate the second gate structure, wherein the first and second etching processes are tuned to differ in at least one parameter such that the first recess is shallower than the second recess and a first distance between the first recess and the first gate structure along the first fin lengthwise is smaller than a second distance between the second recess and the second gate structure along the second fin lengthwise.

In an embodiment, the method further includes epitaxially growing a first semiconductor material in the first recess; and epitaxially growing a second semiconductor material in the second recess. In a further embodiment, a volume of a portion of the second semiconductor material above the second fin is smaller than a volume of a portion of the first semiconductor material above the first fin. In another further embodiment, the second semiconductor material is doped with a higher concentration of a dopant than the first semiconductor material. In yet another embodiment, both the first semiconductor material and the second semiconductor material include silicon germanium, and the second semiconductor material has a higher germanium concentration than the first semiconductor material.

In an embodiment of the method, a ratio of the first distance to the second distance is in a range from 1:1.2 to 1:3. In a further embodiment, the ratio is in a range from 1:2 to 1:3. In another embodiment of the method, the at least one parameter includes etching duration, etching temperature, etching power, etching pressure, a concentration of an etching chemical, a ratio among etching chemicals, or a combination thereof. In another embodiment of the method, the first and second fins are both configured for forming p-type FinFETs or both configured for forming n-type FinFETs.

In an embodiment, the method further includes, before the forming of the second masking element, epitaxially growing a first semiconductor material in the first recess; and after the performing of the second etching process, epitaxially growing a second semiconductor material in the second recess. In another embodiment, the first and second etching processes are performed in a same process chamber.

In another exemplary aspect, the present disclosure is directed to a method. The method includes receiving a structure having a semiconductor substrate with a first region and a second region, a first fin over the first region, a first gate structure engaging the first fin, a second fin over the second region, a second gate structure engaging the second fin, and gate spacers over sidewalls of the first and second gate structures. The method further includes forming a first masking element covering the second region; performing a first etching process to the first fin while the first masking element is over the second region, thereby resulting in a first recess proximate the first gate structure, wherein the first recess extends under the gate spacers for a first distance; removing the first masking element; forming a second masking element covering the first region; and performing a second etching process to the second fin while the second masking element is over the first region, resulting in a second recess proximate the second gate structure. The second recess extends under the gate spacers for a second distance that is smaller than the first distance, wherein a difference between the first and second distances is due to at least one parameter in the first and second etching processes being different. The method further includes epitaxially growing a first semiconductor material in the first recess; and epitaxially growing the first semiconductor material in the second recess, wherein a volume of a first portion of the first semiconductor material above the first fin is larger than a volume of a second portion of the first semiconductor material above the second fin.

In an embodiment of the method, each of the first and the second etching processes includes an anisotropic etching process and an isotropic etching process. In another embodiment of the method, the first and the second etching processes are tuned to differ in one or more etching parameters including etching duration, etching temperature, etching bias, etching power, etching pressure, concentration of etching chemicals, or a ratio among etching chemicals.

In another embodiment of the method, the second recess is etched deeper than the first recess. In yet another embodiment of the method, the first semiconductor material in the second recess is doped with a higher concentration of a dopant than the first semiconductor material in the first recess.

In yet another exemplary aspect, the present disclosure is directed to a semiconductor device. The semiconductor device includes a substrate with a first region and a second region; first and second fins over the first and second regions, respectively; first and second gate structures engaging the first and second fins, respectively; gate spacers over sidewalls of the first and second gate structures; a first epitaxial feature at least partially embedded in the first fin and proximate the first gate structure; and a second epitaxial feature at least partially embedded in the second fin and proximate the second gate structure. A first distance between the first epitaxial feature and the first gate structure along the first fin lengthwise is smaller than a second distance between the second epitaxial feature and the second gate structure along the second fin lengthwise. A depth of the first epitaxial feature into the first fin is smaller than a depth of the second epitaxial feature into the second fin.

In an embodiment of the semiconductor device, a ratio between the first distance and the second distance is in a range from 1:1.2 to 1:3. In another embodiment of the semiconductor device, a portion of the first epitaxial feature above the first fin has a larger volume than a portion of the second epitaxial feature above the second fin. In yet another embodiment of the semiconductor device, the first and the second epitaxial features both include n-type doped silicon or both include p-type doped silicon germanium, and wherein the second epitaxial feature includes a higher concentration of dopants than the first epitaxial feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method performed to a structure that includes a substrate with a first region configured for logic devices and a second region configured for radio frequency (RF) devices, a first fin over the first region, a first gate structure engaging the first fin, a second fin over the second region, a second gate structure engaging the second fin, and gate spacers over sidewalls of the first and second gate structures, the method comprising:
    forming a first masking element exposing portions of the first fin and covering the second region;
    performing a first etching process to the first fin, thereby resulting in a first recess proximate the first gate structure;
    removing the first masking element;
    forming a second masking element exposing portions of the second fin and covering the first region; and
    performing a second etching process to the second fin, resulting in a second recess proximate the second gate structure, wherein the first and second etching processes are tuned to differ in at least one parameter such that the first recess is shallower than the second recess and a first distance between the first recess and the first gate structure along the first fin lengthwise is smaller than a second distance between the second recess and the second gate structure along the second fin lengthwise.

2. The method of claim 1, further comprising:
    epitaxially growing a first semiconductor material in the first recess; and
    epitaxially growing a second semiconductor material in the second recess.

3. The method of claim 2, wherein a volume of a portion of the second semiconductor material above the second fin is smaller than a volume of a portion of the first semiconductor material above the first fin.

4. The method of claim 2, wherein the second semiconductor material is doped with a higher concentration of a dopant than the first semiconductor material.

5. The method of claim 2, wherein both the first semiconductor material and the second semiconductor material include silicon germanium, and the second semiconductor material has a higher germanium concentration than the first semiconductor material.

6. The method of claim 1, wherein a ratio of the first distance to the second distance is in a range from 1:1.2 to 1:3.

7. The method of claim 6, wherein the ratio is in a range from 1:2 to 1:3.

8. The method of claim 1, wherein the at least one parameter includes etching duration, etching temperature, etching power, etching pressure, a concentration of an etching chemical, a ratio among etching chemicals, or a combination thereof.

9. The method of claim 1, wherein the first and second fins are both configured for forming p-type FinFETs or both configured for forming n-type FinFETs.

10. The method of claim 1, further comprising:
    before the forming of the second masking element, epitaxially growing a first semiconductor material in the first recess; and
    after the performing of the second etching process, epitaxially growing a second semiconductor material in the second recess.

11. The method of claim 1, wherein the first and second etching processes are performed in a same process chamber.

12. A method, comprising:
    receiving a structure having a semiconductor substrate with a first region and a second region, a first fin over the first region, a first gate structure engaging the first fin, a second fin over the second region, a second gate structure engaging the second fin, and gate spacers over sidewalls of the first and second gate structures;
    forming a first masking element covering the second region;
    performing a first etching process to the first fin while the first masking element is over the second region, thereby resulting in a first recess proximate the first gate structure, wherein the first recess extends under the gate spacers for a first distance;
    removing the first masking element;
    forming a second masking element covering the first region;
    performing a second etching process to the second fin while the second masking element is over the first region, resulting in a second recess proximate the second gate structure, wherein the second recess extends under the gate spacers for a second distance that is smaller than the first distance, wherein a difference between the first and second distances is due to at least one parameter in the first and second etching processes being different;
    epitaxially growing a first semiconductor material in the first recess; and
    epitaxially growing the first semiconductor material in the second recess, wherein a volume of a first portion of the first semiconductor material above the first fin is larger than a volume of a second portion of the first semiconductor material above the second fin.

13. The method of claim 12, wherein each of the first and the second etching processes includes an anisotropic etching process and an isotropic etching process.

14. The method of claim 12, wherein the first and the second etching processes are tuned to differ in one or more etching parameters including etching duration, etching temperature, etching bias, etching power, etching pressure, concentration of etching chemicals, or a ratio among etching chemicals.

15. The method of claim 12, wherein the second recess is etched deeper than the first recess.

16. The method of claim 12, wherein the first semiconductor material in the second recess is doped with a higher concentration of a dopant than the first semiconductor material in the first recess.

17. A method of forming a semiconductor device, comprising:
    receiving a structure having a semiconductor substrate with a first region configured for logic devices and a second region configured for radio frequency (RF) devices, a first fin over the first region, a first gate structure engaging the first fin, a second fin over the second region, a second gate structure engaging the second fin, and gate spacers over sidewalls of the first and second gate structures;
    forming a first masking element covering the second region;
    performing a first etching process to the first fin, thereby resulting in a first recess proximate the first gate structure, the first recess having a first depth;
    removing the first masking element;
    forming a second masking element covering the first region;
    performing a second etching process to the second fin, resulting in a second recess proximate the second gate structure, the second recess having a second depth that is greater than the first depth;
    epitaxially growing a first semiconductor material in the first recess; and
    epitaxially growing the first semiconductor material in the second recess.

18. The method of claim 17, wherein a first distance between the first recess and the first gate structure along the first fin lengthwise is smaller than a second distance between the second recess and the second gate structure along the second fin lengthwise.

19. The method of claim 17, wherein the first recess extends under the gate spacers for a first distance, and the second recess extends under the gate spacers for a second distance that is smaller than the first distance.

20. The method of claim 17, wherein a volume of a first portion of the first semiconductor material above the first fin is larger than a volume of a second portion of the first semiconductor material above the second fin.

* * * * *